United States Patent [19]

Grabbe

[11] 4,417,266

[45] Nov. 22, 1983

[54] POWER AND GROUND PLANE STRUCTURE FOR CHIP CARRIER

[75] Inventor: Dimitry G. Grabbe, Lisbon Falls, Me.

[73] Assignee: AMP Incorporated, Harrisburg, Pa.

[21] Appl. No.: 293,052

[22] Filed: Aug. 14, 1981

[51] Int. Cl.³ .................... H01L 39/02; H01L 23/48; H01L 29/44

[52] U.S. Cl. ........................... 357/80; 357/70; 357/68; 29/576 R; 29/589; 428/620

[58] Field of Search ................ 357/80, 70, 68; 428/596, 620, 674; 29/576, 589, 591, 827; 361/421

[56] References Cited

U.S. PATENT DOCUMENTS 3,648,122  3/1972  Berglund et al. ............. 29/576 X
4,366,342  12/1982  Breedlove ..................... 357/80 X Primary Examiner—Andrew J. James
Assistant Examiner—Seth Nehrbass
Attorney, Agent, or Firm—Donald M. Boles

[57] ABSTRACT

A chip carrier having a plurality of leads thereon for external interconnection with preferably only one of the leads utilized to provide a source of power to the chip and preferably a single lead utilized as a ground connection. The power and ground leads are connected in a bus structure around the chip at the center of the chip carrier with the chip being secured to the chip carrier with the bus structure over a thermal pad formed within the bus structure. A decoupling capacitor is located in close proximity to the chip on the substrate to assure low reaction due to switching.

2 Claims, 1 Drawing Figure

POWER AND GROUND PLANE STRUCTURE FOR CHIP CARRIER

BACKGROUND OF THE INVENTION

1. Field of the Invention

The invention relates to a chip carrier for semiconductor chips, and more specifically, to a power, ground and decoupling lead structure whereby a minimum number of chip carrier leads are utilized for power and ground connection and whereby a decoupling capacitor is provided in close proximity to the chip.

2. Description of the Prior Art

Chip carriers for integrated circuit chips are well known in the art and are widely used. Such chip carriers have lead arrays thereon which extend from the outer edge of the chip carrier to a central portion of the carrier where they are then connected to bonding pads on semiconductor chips bonded at and to the center of the chip carrier. In these prior art circuits, in order to provide power and/or ground voltages to the appropriate pads on the chip, it has been necessary to use a plurality of these leads on the chip carrier for such purpose. This is due to the fact that the leads on the chip are thin and easily overloaded. For this reason, many leads in parallel have been used to minimize lead resistance. This is wasteful and, also, since the number of leads on the chip is limited, the number of external connections from the chip carrier that can be made is therefore reduced. In addition, the prior art systems have required the use of a discrete decoupling capacitor separate and relatively distant from the chip and chip carrier.

SUMMARY OF THE INVENTION

By using solid copper leads, the resistance is substantially reduced and it is possible to form a bus structure on a ceramic substrate with the chip in the center allowing the chip with its multiple power connections to be bonded directly to the bus structure. The copper lead frame is secured to the ceramic substrate by oxidizing one surface of the lead frame to form copper oxide and then forming a bond of the copper oxide and ceramic by the procedure described in the U.S. Pat. Nos. of Burgess et al. (3,744,120), Babcock et al. (3,766,634), Burgess et al. (3,854,892), Burgess et al. (3,911,553), Cusano et al. (3,994,430) and Cusano et al. (4,129,243).

In accordance with the present invention, there is provided a lead structure whereby connection can be made from a power and ground pattern directly to the semiconductor chip pads with only one chip carrier lead being required for each of the sources of power and ground potential. Also, the lead pattern for providing power and ground connection provides the ability to permit a decoupling capacitor structure for the system in close proximity to the chip.

The above is accomplished by a chip carrier having a plurality of leads thereon for external interconnection with preferably only one of the leads utilized to provide a source of power to the chip and preferably a single lead utilized as a ground connection. The power and ground leads are connected in a bus structure around the chip at the center of the chip carrier with the chip being secured to the chip carrier with the bus structure over a thermal pad formed within the bus structure. A decoupling capacitor is located in close proximity to the chip on the substrate to assure low reactance due to switching.

BRIEF DESCRIPTION OF THE DRAWING

The FIGURE is a top view of a chip carrier having a lead structure in accordance with the present invention.

DESCRIPTION OF THE PREFERRED EMBODIMENT

Figure 1:
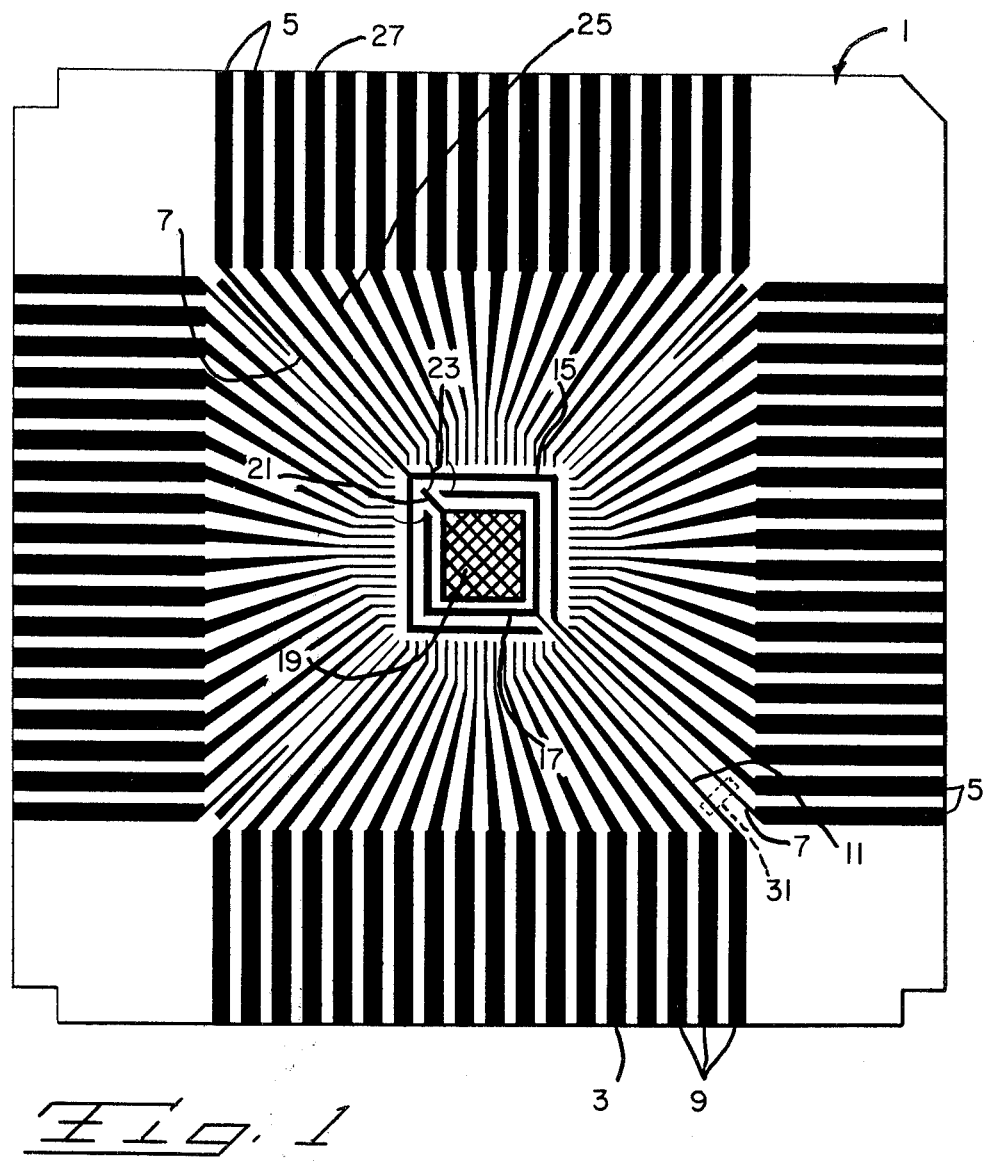

Referring to the FIGURE, there is shown a semiconductor chip carrier 1 of standard construction. Such chip carriers are usually formed from aluminium oxide, beryllium oxide, or other similar electrically insulating ceramic types of material. A copper lead pattern 3 is formed on the chip carrier 1 as described hereinbelow, the leads 5 and 9 of the lead array being utilized to provide power and a source of ground potential respectively from an external source to the semiconductor chip as will be described hereinbelow. The lead 5 includes a portion 7 which is coupled to a lead portion 15 which surrounds the area in which a semiconductor chip (not shown) will be disposed on the substrate. A lead portion 17 is connected to the lead 9 through the lead portion 11. It can therefore be seen that the power lead 15 surrounds the ground lead 17 around the center portion of the chip carrier over which the semiconductor chip will be mounted in a manner to be described hereinbelow.

Within the leads 15 and 17 is a copper chip attaching pad 19 which conducts heat from the chip attached thereto. A tab 21 connected to pad 19 can be connected via wire 23 to lead 25 and pad 27 in the event the back side of the chip must be at a predetermined potential. A decoupling capacitor 31 is formed across lead portions 7 and 11, closely adjacent pad 19 and the semiconductor to be disposed thereon.

To secure the lead frame to the substrate, the copper lead frame is oxidized on one side initially and the oxidized side is properly positioned on the ceramic substrate 1, the lead frame and substrate then being heated to about 1068° C., a temperature at which the copper oxide melts and fuses with the substrate but below the melting point of the copper. These procedures are set forth in more detail in the above noted patents.

Though the invention has been described with respect to a preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A system for carrying semiconductor chips and the like comprising:
   (a) an electrically insulating ceramic substrate,
   (b) a copper electrical conductor pattern having a copper oxide surface adjacent said substrate and fused to said substrate, said conductor pattern extending to plural locations at the edges of said substrate,
   (c) an electrically and thermally conductive pad at the center of said substrate for receiving a semiconductor chip thereon,
   (d) a first electrically conductive pattern on said substrate surrounding said pad and connected to a lead of said conductor pattern, and
   (e) a second electrically conductive pattern on said substrate surrounding said pad within said first conductive pattern and connected to a lead of said conductor pattern.

2. A system as set forth in claim 1 further including means connecting said pad to said conductor pattern.

* * * * *